United States Patent
Chen et al.

(10) Patent No.: US 8,048,716 B2
(45) Date of Patent: Nov. 1, 2011

(54) STRUCTURE OF EMBEDDED ACTIVE COMPONENTS AND MANUFACTURING METHOD THEREOF

(75) Inventors: Shou-Lung Chen, Hsinchu (TW); Cheng-Ta Ko, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 12/382,526

(22) Filed: Mar. 18, 2009

(65) Prior Publication Data

US 2009/0179347 A1    Jul. 16, 2009

Related U.S. Application Data

(62) Division of application No. 11/252,572, filed on Oct. 19, 2005, now abandoned.

(30) Foreign Application Priority Data

Nov. 19, 2004 (TW) .............................. 93135743 A

(51) Int. Cl.
*H01L 21/00* (2006.01)
(52) U.S. Cl. .................. 438/108; 257/E23.02; 257/774; 257/786; 438/109; 438/612
(58) Field of Classification Search .......... 438/106, 438/121, 108, 109, 612, 614; 257/678, 723, 257/729, 693, 698, 774, 788, E23.019, E23.092, 257/E23.02, 778–781, 786; 264/272.17; 174/52.1, 52.2
See application file for complete search history.

(56) References Cited

U.S. PATENT DOCUMENTS

| | | | |
|---|---|---|---|
| 5,151,769 A | 9/1992 | Immorlica et al. | |
| 5,452,182 A | 9/1995 | Eichelberger et al. | |
| 5,497,033 A | 3/1996 | Fillion et al. | |
| 5,891,795 A * | 4/1999 | Arledge et al. | 438/613 |
| 6,027,958 A | 2/2000 | Vu et al. | |
| 6,479,890 B1 | 11/2002 | Trieu et al. | |
| 6,699,731 B2 * | 3/2004 | Huang et al. | 438/108 |
| 6,717,248 B2 | 4/2004 | Shin et al. | |
| 7,276,783 B2 * | 10/2007 | Goller et al. | 257/678 |
| 2002/0027273 A1 * | 3/2002 | Huang | 257/678 |
| 2003/0155638 A1 * | 8/2003 | Ito | 257/678 |
| 2004/0113261 A1 | 6/2004 | Sunohara et al. | |
| 2004/0129452 A1 | 7/2004 | Owens | |
| 2004/0159933 A1 * | 8/2004 | Sunohara et al. | 257/700 |
| 2004/0219711 A1 * | 11/2004 | Wu et al. | 438/106 |
| 2005/0224988 A1 * | 10/2005 | Tuominen | 257/774 |

OTHER PUBLICATIONS

U.S. Office Action dated Jan. 29, 2010 for U.S. Appl. No. 12/232,019.

* cited by examiner

*Primary Examiner* — Chris Chu
(74) *Attorney, Agent, or Firm* — Morris Manning Martin LLP; Tim Tingkang Xia, Esq.

(57) ABSTRACT

A structure of embedded active components and the manufacturing method thereof are provided. The manufacturing steps involve providing a molding plate, and setting several active components on the molding plate as first. A dielectric layer covers the molding plate to cap the active components. An electric circuit is formed on the dielectric layer, in contact with the active components. Finally, the structure with embedded active components is released from the molding plate.

19 Claims, 5 Drawing Sheets

STRUCTURE OF EMBEDDED ACTIVE COMPONENTS AND MANUFACTURING METHOD THEREOF

PRIORITY STATEMENT

This application is a divisional of application Ser. No. 11/252,572, filed Oct. 19, 2005 now abandoned, which claims priority under 35 U.S.C. §119(a) on Taiwanese Patent Application No. 93135743 filed in Taiwan on Nov. 19, 2004, the entire contents of which are hereby incorporated by reference.

BACKGROUND

1. Field of Invention

The invention relates to a package structure and the manufacturing method thereof. In particular, it relates to a structure of embedded active components and the method of making the same.

2. Related Art

In order to create larger space and to enhance the functions of the module within a limited substrate area, shrunk or embedded passive components are often used to minimize the circuit layout and to reduce the signal transmission distance. Thus, more space is left for installing active components and enhancing the overall performance. Therefore, substrates with passive components such as embedded resistors, capacitors, and inductors are developed.

In order to more effectively minimize the packaging of the components, methods of embedding active components (such as IC chips) on a substrate have been developed. The substrate with an embedded IC module as disclosed in the U.S. Pat. No. 5,497,033 has a plurality of chips installed thereon. A molding plate is first used to enclose the chips to be the embedded components. A molding material then covers the chips using the conventional molding method. The chips are thud embedded in the molding material after curing. However, this method completes the whole process of embedding components on the substrate. It is likely to damage other components not to be embedded. The finished substrate is not flexible and has limited applications.

In the U.S. Pat. No. 6,027,958, a transferring manufacturing method for the flexible IC components is teached. A semiconductor substrate with silicon on insulator (SOI) structure is provided to form the required IC thereon. An adhesive layer is used to attach another flexible substrate on the IC. Finally, etching is employed to remove the semiconductor substrate, thereby transferring the IC onto the surface of the flexible substrate.

SUMMARY

In view of the foregoing, an objective of the invention is to provide a structure of embedded active components and the method of making the same. By forming an embedded structure with multiple active components, the alignment problem in subsequent packaging can be solved. Moreover, the active components are electrically tested. Therefore, the invention can effectively increase the product yield.

The disclosed method for making the structure of embedded active components includes the steps of: providing a molding plate; disposing with alignment a plurality of active components on the molding plate; covering a dielectric layer on the molding plate to cap the active components; making a circuit on the dielectric layer, in contact with the active components; and releasing the dielectric layer embedded with the active components from the molding plate.

The dielectric layer may be a polymer layer. The step of making a circuit on the dielectric layer can be performed by forming a plurality of conductive holes connecting to the active components on the dielectric layer and then forming the circuit passing through the conductive hole.

The invention further discloses a structure of embedded active components, which comprises a dielectric layer, a plurality of active components, and a circuit. The active components are embedded into the dielectric layer. The circuit is installed on the dielectric layer and connected to the active components.

BRIEF DESCRIPTION OF THE DRAWINGS

The invention will become more fully understood from the detailed description given hereinbelow illustration only, and thus are not limitative of the present invention, and wherein.

DETAILED DESCRIPTION

Figure 1:
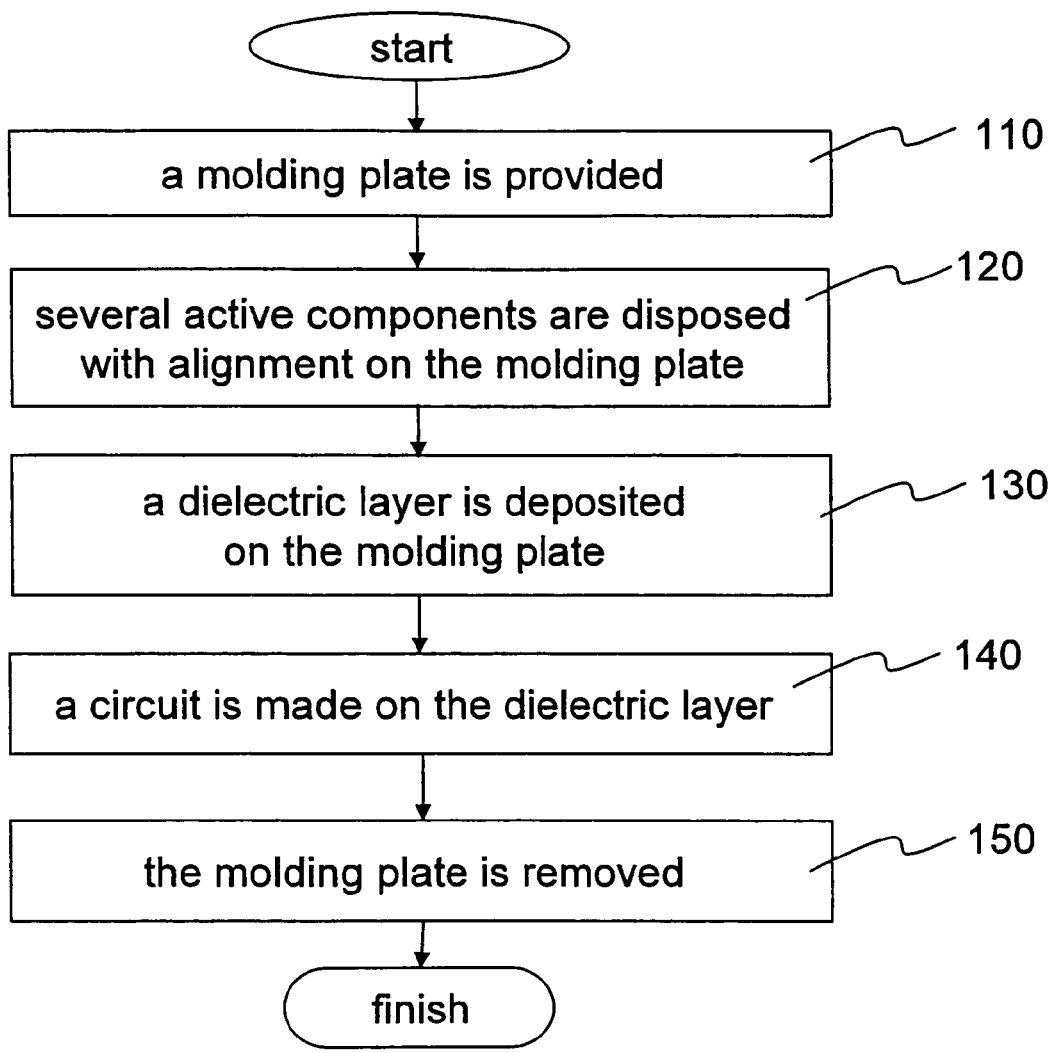
FIG. 1 is a schematic view of the disclosed method.

The steps of the disclosed method are shown in FIG. 1. First, a molding plate is provided (step 110). Several active components are disposed with alignment on the molding plate (step 120). A dielectric layer is deposited on the molding plate (step 130) to cover the active components. A circuit is made on the dielectric layer (step 140), in contact with the active components. Finally, the molding plate is removed (step 150), releasing the dielectric layer with embedded active components from the molding plate. One then obtains a structure of embedded active components.

When the dielectric layer is a polymer layer, it can be a preprocessed or existing polymer layer, such as the Ajinomoto build-up film (ABF) or the resin coated copper foil (RCC). The above process also includes the step of embossing to embed active components into the polymer layer or the step of coating a polymer solution followed by curing to form the dielectric layer. The latter includes the steps of: covering a polymer solution on the active components by spraying, spin-coating, or printing; and curing the polymer solution to form a polymer layer.

Step 140 in FIG. 1 makes a circuit on the insulator. Several conductive holes connecting to the active components are first formed on the dielectric layer, followed by forming the circuit passing through the conductive holes.

The process in an embodiment of the invention is further described in detail with reference to FIGS. 2A to 2F.

Figure 2A:
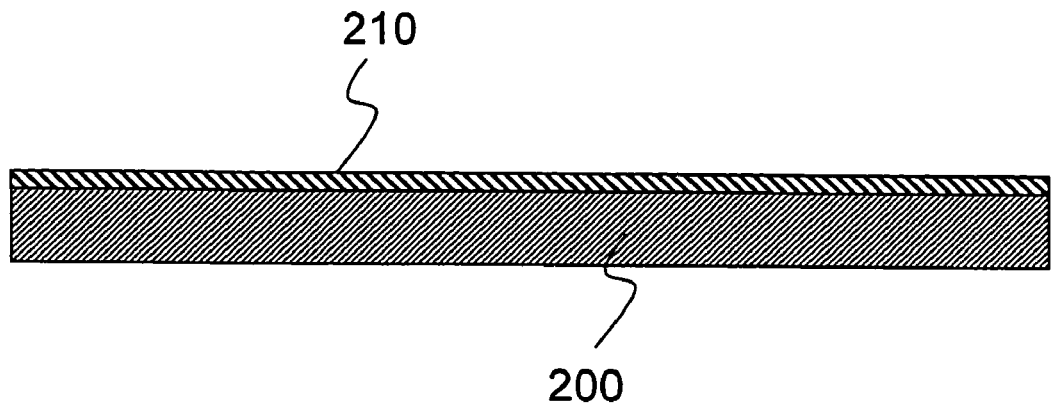
FIGS. 2A to 2F are schematic cross-sectional views of the manufacturing process according to an embodiment of the invention.

As shown in FIG. 2A, a metal mold-departing layer 210 is deposited on a molding plate 200. The molding material can be Teflon that can be readily removed from the molding plate. The mold-departing layer can be made of any other material with a similar property.

Figure 2B:
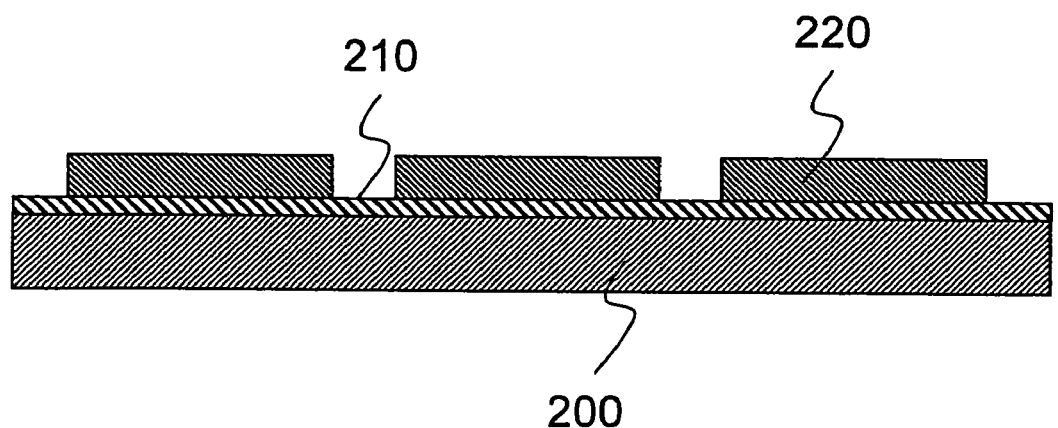

As shown in FIG. 2B, the active components 220 are disposed with alignment on the molding plate 200.

Figure 2C:
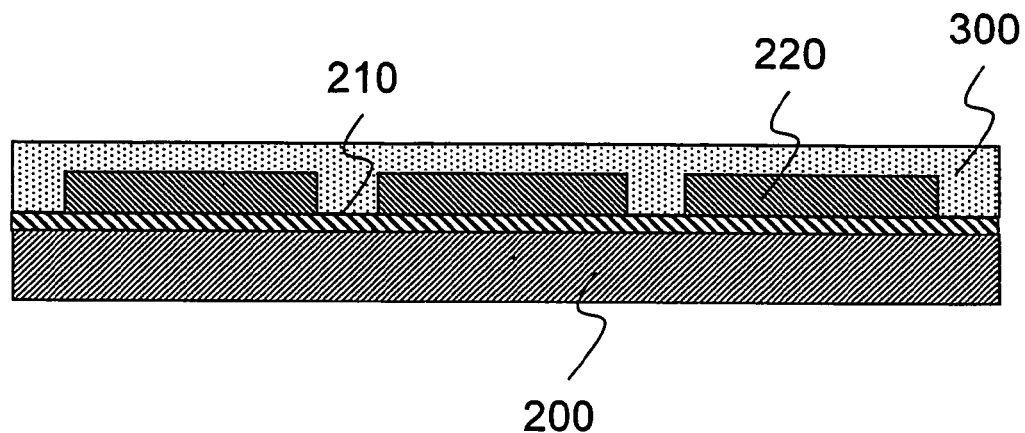

As shown in FIG. 2C, a polymer layer 300 is coated on the molding plate 200 as a dielectric layer to cover the active components. The polymer layer is cured according to the properties of the selected polymer.

Figure 2D:
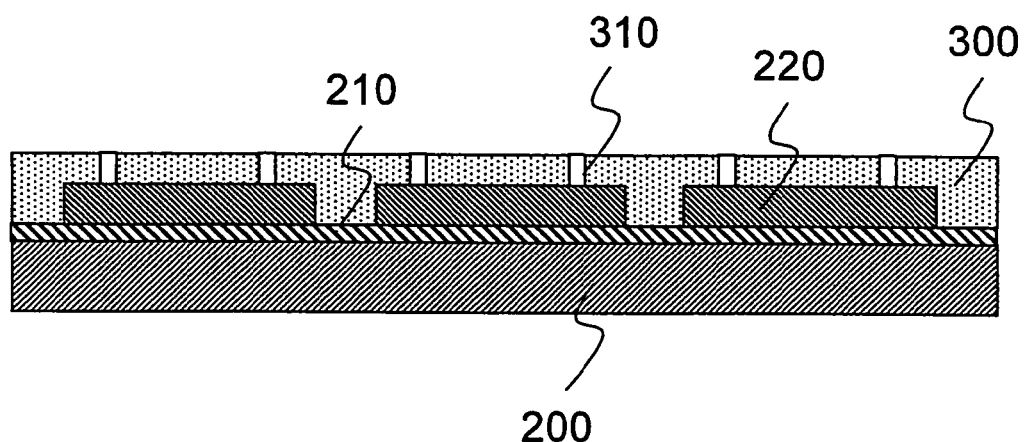

As shown in FIG. 2D, several holes 310 connecting to the active components 220 are formed in the polymer layer 300. The holes 310 can be formed using laser, etching, or direct exposure. The holes 310 are further processed by desmearing.

Figure 2E:
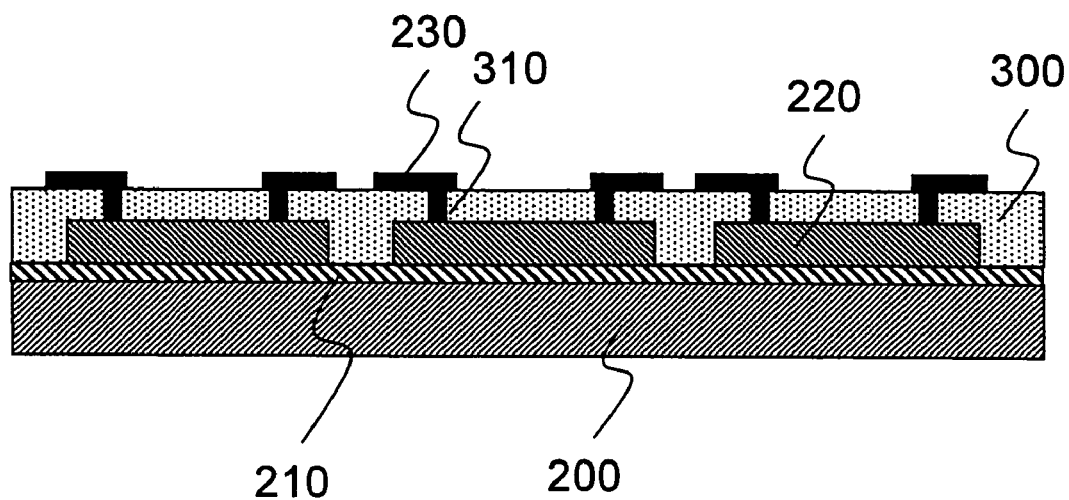

As shown in FIG. 2E, a metal 230 is deposited on the polymer layer 300 and in the holes 310 to render the holes 310 conductive. Photolithography is employed to transfer the required pattern onto the metal 230 on the polymer layer 300, thereby forming a circuit on the polymer layer 300 with the conductive holes 310 connecting the circuit to the active components 220.

Figure 2F:
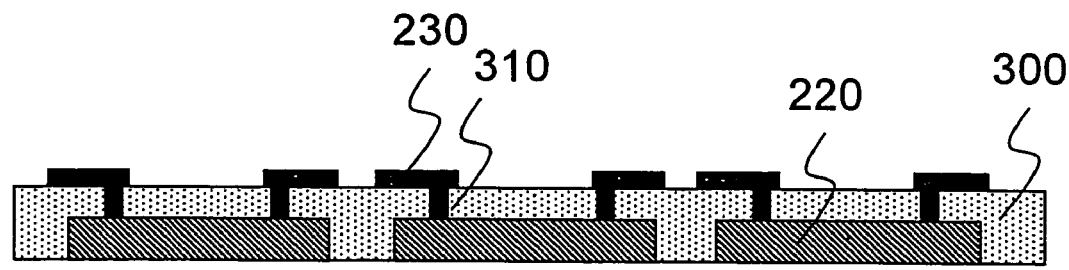

Finally, as shown in FIG. 2F, the molding plate is released from the polymer layer 300 embedded with active components 220 to form a structure of embedded active components.

The structure of embedded active components formed using the process of the disclosed embodiment is shown in FIG. 2F to contain the polymer layer 300, the active components 220, and the circuit. The active components 220 are embedded in the polymer layer 300. The circuit is formed on the polymer layer 300 and connected to the active components 220 via the conductive holes.

Figure 3:
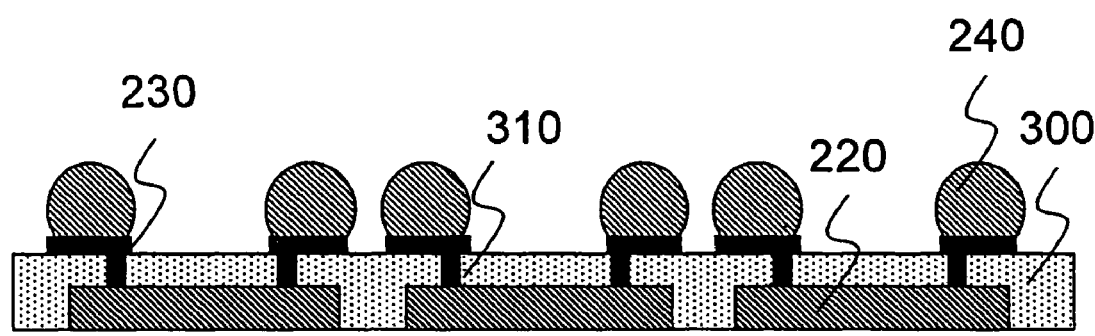
FIG. 3 is a schematic cross-sectional view of another embodiment of the invention.

FIG. 3 shows a cross-sectional view of another embodiment of the invention. The above-mentioned structure of embedded active components can be implanted with soldering balls 240 at the contact points of the circuit for subsequent electrical connections.

The disclosed structure of embedded active components can be installed with an arbitrary substrate, such as the semiconductor substrate, flexible substrate, or glass substrate. Since the active components have fixed relative positions, only one alignment is required to fix the positions of all the active components. This can greatly lower the difficulty in subsequent processes and increase the product yield.

Certain variations would be apparent to those skilled in the art, which variations are considered within the spirit and scope of the claimed invention.

What is claimed is:

1. A method of making a structure of embedded active components, comprising sequential steps of:
    providing a molding plate;
    disposing with alignment a plurality of active components on the molding plate;
    covering a dielectric layer on the molding plate to cap the active components;
    forming a plurality of holes in the dielectric layer, said holes extending to the active components;
    depositing a metal in the holes;
    forming a metal extension on the dielectric layer and electrically coupled to the active components via the metal in the holes; and
    releasing the dielectric layer embedded with the active components from the molding plate.

2. The method of claim 1, wherein the dielectric layer is a polymer layer.

3. The method of claim 2, wherein the polymer layer is selected from the group consisting of Ajinomoto build-up film (ABF) and resin coated copper foil (RCC).

4. The method of claim 2, further comprising the step of:
    embedding the active components into the polymer layer by embossing.

5. The method of claim 2, wherein the step of covering a dielectric layer on the molding plate contains the steps of:
    covering a polymer solution on the active components; and
    curing the polymer solution.

6. The method of claim 5, wherein the step of covering a polymer solution on the active components is implemented using a method selected from spraying, spin-coating, and printing.

7. The method of claim 2, wherein, in said covering, the active components are completely buried in said polymer layer, except for bottoms portions that rest on the molding plate.

8. The method of claim 1, wherein the material of the molding plate is Teflon.

9. The method of claim 1, wherein the molding plate contains a mold-separating layer.

10. The method of claim 9, wherein the mold-separating layer is a metal mold-separating layer.

11. The method of claim 1, further comprising the step of:
    implanting soldering balls at contact points of the electrical circuit.

12. A method of making a structure of embedded active components, comprising the steps of:
    providing a molding plate;
    disposing a plurality of active components on the molding plate;
    covering a dielectric layer on the molding plate and the active components;
    forming a plurality of holes in the dielectric layer, said holes extending to the active components;
    depositing a metal in the holes;
    forming a metal extension on the dielectric layer and electrically coupled to the active components via the metal in the holes; and
    releasing the dielectric layer embedded with the active components from the molding plate.

13. The method of claim 12, wherein the holes are formed by a method selected from the group consisting of laser drilling, exposure and developing, and etching.

14. The method of claim 12, wherein the step of forming the metal extension includes the steps of:
    depositing a metal layer on the dielectric layer; and
    employing photolithography to transfer a required pattern to the metal layer to form said metal extension.

15. The method of claim 12, further comprising the step of: desmearing the holes.

16. The method of claim 12, wherein the dielectric layer is a polymer layer.

17. The method of claim 16, wherein, in said covering, topmost portions of the active components are completely buried under a non-zero thickness of said polymer layer, and said holes are formed through said non-zero thickness of said polymer layer.

18. A method of making a structure of embedded active components, comprising the sequential steps of:
    providing a molding plate, wherein the molding plate has a mold-separating layer being deposited on the molding plate;
    disposing with alignment a plurality of active components on the molding plate;
    covering a dielectric layer on the molding plate to cap the active components, wherein the dielectric layer is Ajinomoto build-up film (ABF);
    forming a plurality of holes in the ABF, said holes extending to the active components;
    depositing a metal in the holes and on the ABF;
    forming an electrical circuit on the dielectric layer to be in electrical communications with the active components; and
    releasing the dielectric layer embedded with the active components from the molding plate;
    wherein said electrical circuit is formed by patterning the metal deposited on the ABF into said electrical circuit electrically coupled to the active components via the metal in the holes.

19. The method of claim 18, wherein, in said covering, said ABF completely buries topmost portions of the active components.

* * * * *